United States Patent
Baron et al.

[11] Patent Number: 5,457,337
[45] Date of Patent: Oct. 10, 1995

[54] LOW-NOISE GAIN-MODE IMPURITY BAND CONDUCTION DETECTOR DESIGN

[75] Inventors: Robert Baron, Santa Monica; Le T. Pham, Ventura; John P. Sheppard, Valley Center; William R. Peterson, Los Angeles, all of Calif.

[73] Assignee: Hughes Aircraft Company, Los Angeles, Calif.

[21] Appl. No.: 319,751

[22] Filed: Oct. 7, 1994

[51] Int. Cl.⁶ ............................. H01L 27/14; H01L 31/00
[52] U.S. Cl. .................. 257/439; 257/459; 257/607; 257/655; 437/3
[58] Field of Search ........................ 257/439, 459, 257/607, 655; 437/3

[56] References Cited

U.S. PATENT DOCUMENTS

| | | | |
|---|---|---|---|
| 4,313,127 | 1/1982 | Su et al. | 357/30 |
| 4,568,960 | 2/1986 | Petroff et al. | 357/30 |
| 4,586,068 | 4/1986 | Petroff et al. | 357/30 |
| 4,586,074 | 4/1986 | Stapelbroek et al. | 357/58 |
| 4,896,202 | 1/1990 | Bharat et al. | 257/439 |
| 4,962,304 | 10/1990 | Stapelbroek et al. | 257/432 |
| 5,001,532 | 3/1991 | Petroff | 257/436 |
| 5,291,055 | 3/1994 | Farhoomand et al. | 257/436 |

*Primary Examiner*—Ngân V. Ngô
*Attorney, Agent, or Firm*—V. D. Duraiswamy; Wanda Denson-Low

[57] ABSTRACT

The photo-sensitive detector region of conventional Impurity Band Conduction (IBC) detector (also known as a Blocked Impurity Band [BIB] detector) is divided into a wide detection (or collection) region and a narrow gain region by means of tailoring the doping profile. The narrow gain region is that portion of the photo-sensitive detector region closest to the blocking layer, where the electric field is the largest, whose As concentration is made smaller (in the range of 2 to $5 \times 10^{17}$ cm$^{-3}$) to increase the impact ionization coefficient by decreasing the electron scattering. The wide detection region is that portion of the photo-sensitive detector region furthest from the blocking layer, where the electric field is smallest and the As concentration is larger (in the range of 5 to $8 \times 10^{17}$ cm$^{-3}$) to decrease the impact ionization coefficient by increasing the electron scattering.

13 Claims, 1 Drawing Sheet

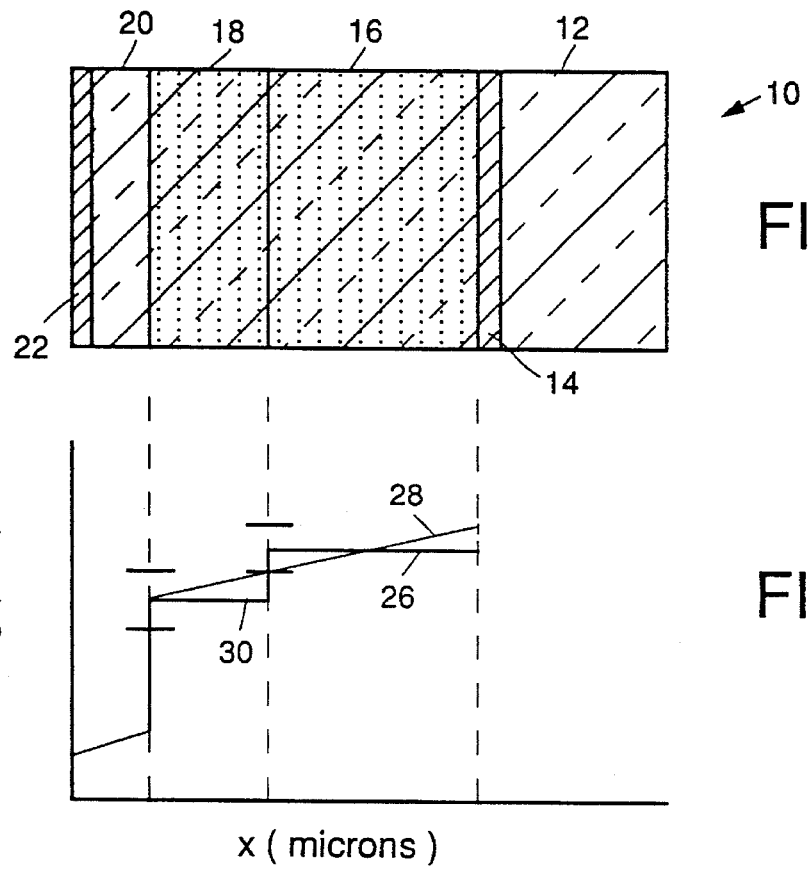
FIG. 1a.
FIG. 1b.
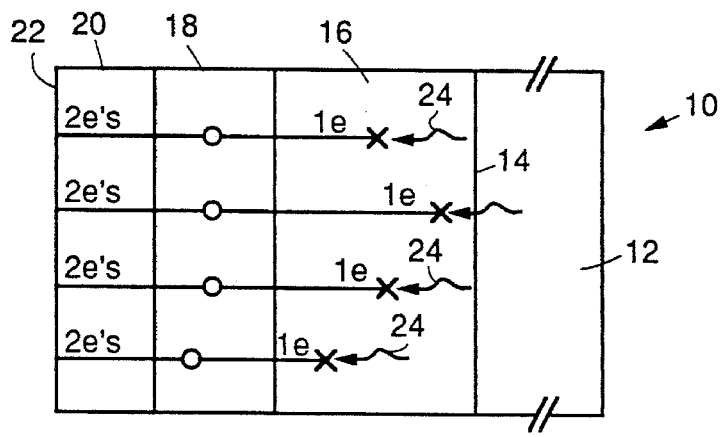
FIG. 2a.
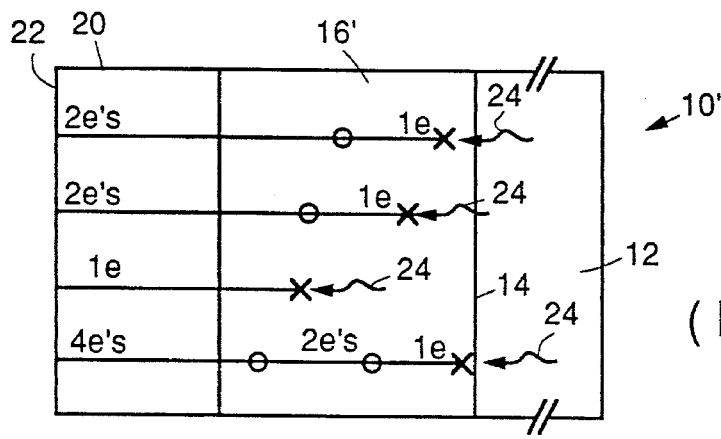
FIG. 2b.
(PRIOR ART)

LOW-NOISE GAIN-MODE IMPURITY BAND CONDUCTION DETECTOR DESIGN

This invention was made with Government support under F29601-88-C-0025 (S-Cubed/Maxwell Labs 911102, Subtask 03-07/00) awarded by the Air Force. The Government has certain rights in this invention.

BACKGROUND OF THE INVENTION

1. Field of the Invention

The present invention relates generally to semiconductor detectors, and, more specifically, to photo-sensitive detectors.

2. Description of Related Art

Detection and imaging systems capable of operating in the long wavelength infrared (LWIR) range are used in, for example, space surveillance systems. For the purposes of the present application, the term LWIR is intended to mean those wavelengths considerably in excess of 1 µm, typically on the order of 10 to 15 µm and extending to nearly 30 µm.

These LWIR systems impose critical performance limitations on such parameters as resolution, field-of-view, operating temperature, responsivity, detectivity, ease of calibration, and radiation hardness.

Detectors based on impurity band conduction (IBC detectors), also known as Blocked Impurity Band (BIB) detectors, have been disclosed in, e.g., U.S. Pat. Nos. 4,568,960, 4,586,074, 4,586,068, and 4,313,127. These detectors are useful in the LWIR range required and typically comprise an active layer which is doped with a sufficient amount of either a donor or an acceptor impurity such that significant charge transport can occur in an impurity band in addition to the charge transport of electrons in the conduction band of the active layer and of holes in the valence band of the active layer. A blocking layer is disposed on the active layer and contains a sufficiently low concentration of impurities that significant charge transport cannot occur in the blocking layer except by means of electrons in the conduction band of the blocking layer and by means of holes in the valence band of the blocking layer. Conventional IBC detectors can be operated in a gain mode. However, a disadvantage of the IBC detector in gain-mode is significant gain dispersion noise.

Thus, improvement in the performance of gain-mode IBC detectors is needed.

SUMMARY OF THE INVENTION

In accordance with the present invention, a low-noise gain-mode impurity band conduction detector is provided. The detector comprises:

(a) a semiconductor substrate;
(b) a first contact layer formed on one surface of the substrate;
(c) a detecting layer formed on the first contact layer, the detecting layer having a first thickness and a first dopant concentration;
(d) a gain layer formed on the detecting layer, the gain layer having a second thickness and a second dopant concentration, the second thickness less than that of the first thickness and the second dopant concentration less than that of the first dopant concentration;
(e) a blocking layer, whose doping level is lower than both of the detecting and gain layers, formed on the gain layer; and
(f) a second contact layer formed on the blocking layer.

The purpose of the present invention is to improve the performance of gain-mode IBC detectors by reducing the excess noise (gain dispersion noise) that is caused by the impact ionization gain mechanism of the devices. Reducing the length of the gain region lowers the gain dispersion noise. At the same time, providing a wide detecting, or collection, region in which impact ionization gain is suppressed by the higher doping level allows one to maximize the quantum efficiency. Having two separate regions gives one the freedom to optimize each region for its separate purpose, allowing one to achieve a detector with combined high quantum efficiency, broad spectral response, and low noise.

BRIEF DESCRIPTION OF THE DRAWINGS

FIG. 1a is a cross-sectional view of the gain-mode detector of the present invention;

FIG. 1b, on coordinates of arsenic concentration and distance (in µm), illustrates two possible As doping profile versus position for the device shown in FIG. 1a;

FIG. 2a is a view similar to that of FIG. 1a, schematically depicting the gain in number of electrons detected and showing that the narrow gain region of the present invention produces a unity gain dispersion factor; and FIG. 2b is a view similar to that of FIG. 2a, but for a conventional impurity band conduction detector, showing that the wider gain region of the prior art device leads to higher gain dispersion noise.

DESCRIPTION OF THE PREFERRED EMBODIMENTS

Turning now to the drawings, wherein like numerals designate like elements throughout, FIG. 1a shows a gain-mode detector 10 of the present invention. The gain-mode detector 10 comprises a semiconductor substrate 12, on which a buried contact 14 is formed, followed by a detecting (collection) layer 16, a gain layer 18, a blocking layer 20, and a front contact 22. The semiconductor substrate 12 may comprise silicon or germanium, although other semiconductor materials, such as III-V materials, e.g., GaAs, may also be employed in the practice of the invention. In this connection, any semiconductor with appropriate energy levels for the dopants and that can be grown in an IBC structure could be used, although the difficulty of fabrication would probably be greater than that for Si or Ge.

The semiconductor substrate 12 may be n- or p-type, and is preferably of the opposite conductivity type to the detector. The succeeding layers employ the same material as the substrate.

In the case of an n-type silicon detector, the buried contact 14 is formed by doping silicon with antimony or arsenic to provide a peak concentration of at least about $5 \times 10^{18}$ cm$^{-3}$ so as to remain a good contact at cryogenic temperatures (be doped above the metal-insulator transition). Care must also be taken to not dope much above this value and to keep the contact thin for it to be transparent to incident optical radiation. The blocking layer 20 comprises silicon doped lightly enough that impurity band conduction is negligible, typically less than about $10^{15}$ cm$^{-3}$. Ordinarily, the silicon in the blocking layer is not intentionally doped. The front contact 22 comprises silicon doped with arsenic to a level of about $10^{19}$ to $10^{20}$ cm$^{-3}$. These values are well-known in the art for this type of device.

Optical radiation (not shown in FIG. 1a, but indicated in FIGS. 2a and 2b as 24) impinges on the detector 10 through the silicon substrate 12. It will be readily appreciated by those skilled in this art that a conventional IBC detector combines the detecting layer 16 and the gain layer 18 into a single layer (shown in FIG. 2b as 16') that performs both detecting (collection) and gain functions.

Such detectors, which are typically operated at a temperature of 10K, may be used over the wavelength range of about 1 to 100 μm. The upper range is constrained to about 27 μm by the use of arsenic as the dopant for a silicon detector. While the lower limit is 1 μm, as indicated above, the practical lower limit is above the upper limit of HgCdTe IR detectors, simply because such HgCdTe detectors do not require cooling to 10K. The upper range may be varied by using a different dopant or by using Ge as the semiconductor material. Alternate dopants include those shallow dopants that exhibit impurity banding; in the case of silicon, such possible alternate dopants include gallium, phosphorus, and boron. For germanium as the semiconductor material, the ionization energies of the shallow dopants are much smaller than in silicon, and the upper wavelength limit is about 100 μm.

FIG. 1b shows the doping profile of the gain mode detector 10 of FIG. 1a. The As doping profile is tailored for minimum noise performance. The detecting region 16 is wide, having a width which is greater than 6 μm thick, and has either a flat (line 26) or graded (line 28) As concentration in the range of about 4 to $10 \times 10^{17}$ cm$^{-3}$. Preferably the detecting region 16 has a thickness exceeding 10 μm and an As concentration in the range of about 5 to $8 \times 10^{17}$ cm$^{-3}$.

The thickness of the detecting layer 16 must be thick enough to obtain good quantum efficiency; at a level below that given above, the performance of the device degrades due to the lower quantum efficiency. The thickness of the detecting layer 16 further depends on the As doping profile: heavier As doping permits a thinner detecting layer 16.

The lower level of the dopant concentration in this layer 16 is dictated by the gain mechanism, which is suppressed at higher As concentrations by neutral impurity scattering from the arsenic. The gain begins to be suppressed at arsenic concentrations above about $4 \times 10^{17}$ cm$^{-3}$. On the other hand, if the arsenic concentration is too high, then device performance drops off, due to an increase in leakage and dark current.

The gain region 18 is comparatively narrow, having a width of about 1 to 6 μm thick and has either a flat (line 30) or graded (continuation of line 28) As doping in the range of 1 to $5 \times 10^{17}$ cm$^{-3}$. Preferably, the gain region 18 has a thickness in the range of about 3 to 4 μm and an As concentration in the range of about 2 to $5 \times 10^{17}$ cm$^{-3}$.

The thickness of the gain layer 18 must be thick enough to provide gain, but not so thick as to lose the low-noise aspect provided by the presence of this separate layer. In this connection, the gain layer 18 must be small relative to the detecting layer 16, in order to restrict the number of transitions that can take place. The thickness of the gain layer 18 could be increased, however, by decreasing the electric field impressed on the device 10.

The dopant concentration is constrained at the lower end by poor charge transport, in which the mobility of the impurity band carriers is too low, and at the upper end by scattering due to an increase in As concentration, which, as indicated above, suppresses gain.

The blocking layer 20, which is 3 to 4 μm thick, is undoped (intentionally undoped) and has typical maximum As concentration of 1 to $10 \times 10^{15}$ cm$^{-3}$.

The detector 10 of the present invention is fabricated using any of the commonly employed processes, such as chemical vapor deposition (CVD), molecular beam epitaxy (MBE), and the like. The formation of the individual layers may be done continuously or step-wise, in which the process is stopped at the completion of deposition of a particular layer, that layer is etched back slightly, and growth of the next layer is initiated. In this connection, it should be noted that the boundary between the gain layer 18 and the blocking layer 20 should be as sharp as possible. On the other hand, the boundary between the detecting layer 16 and the gain layer 18 need not be abrupt, and in the case of a graded arsenic concentration, is smooth.

Referring now to FIGS. 2a and 2b, a comparison between the device structure of the present invention (FIG. 2a) and the device structure of the prior art (FIG. 2b) is presented. Although the mechanism depicted in these Figures is simplified, it is nonetheless instructive in illustrating the low noise provided by the creation of the gain layer 18 of the present invention.

In FIG. 2a, the narrow gain region 18 of the present invention produces a unity gain dispersion factor, beta, whereas the wider gain region 16' of the prior art IBC detector (FIG. 2b) leads to a higher beta.

This arises from the following considerations:

For the detector 10 of the present invention shown in FIG. 2a, the average gain <G> is 2, based on 4 electrons impinging on the detecting area 16, resulting in 8 electrons output to the front contact 22. Consequently, <G$^2$>= 4. The gain dispersion factor β is given by $$\beta = <G^2>/<G>^2 = 4/2^2 = 1.0.$$

For the prior art detector 10' shown in FIG. 2b, the gain <G> is 2.25, based on 4 electrons impinging on the detecting area 16', resulting in 9 electrons output to the front contact 22. Consequently, <G$^2$>=6.25. The gain dispersion factor thus is $6.25/2.25^2 = 1.23$.

The current noise in an IBC detector with gain is given by $$i_n = (2qI<G>\beta)^{1/2},$$

where β is as defined above, q is the charge on an electron, and I is the current. Reducing the length of the gain region 18 for a given value of gain reduces β. The principle behind this is shown schematically in FIGS. 2a and 2b. The gain is controlled by the impact ionization rate, which is a function of both the bias voltage, through its effect on the electric field, and the As concentration, through its effect on the scattering rate. Increased scattering reduces the probability that an electron can gain enough energy from the electric field to cause impact ionization of an electron from a neutral As site. A conventional IBC detector with uniform As doping could operate in the gain mode if sufficient bias could be applied before punchthrough breakdown. However, the length of the gain region, as determined by the electric field distribution, would be significantly larger than can be achieved with the configuration of the present invention. The conventional device would exhibit poorer performance than the low-noise device of the present invention due to higher gain dispersion noise. Optimal As concentration and thickness for the detection and gain regions can be used to produce gain-mode IBC detectors, with very low gain dispersion noise and high quantum efficiency.

EXAMPLES

Several detector profiles were fabricated, in which either graded or stepped As doping profiles were used in the gain and detection layers. Also, the gain layer thickness was varied from 1 to 2 μm on two different samples. Table I below shows the comparison between the prior art detector and various configurations of the detector of the present invention. In Table I, the term [As] refers to the arsenic concentration in $cm^{-3}$, T is the thickness of the indicated layer, and E is the conventional exponential notation.

TABLE I

| | | Detector Profiles. | | | |
|---|---|---|---|---|---|
| Layer | Type | Prior Art | Gain A Graded | Gain B Stepped | Gain C Stepped |
| Blocking | T(μm) | 3–4 | 3–4 | 3–4 | 3–4 |
| | [As] | | | | |
| Gain | T(μm) | 0 | ~3 | 1 | 2 |
| | [As] | | 3–5E17 | 4E17 | 4E17 |
| Collection | T (μm) | 25 | 21 | 24 | 23 |
| | [As] | 5E17 | 5–8E17 | 7E17 | 7E17 |
| Measured Gain | | 2.3 | 1.7 | 1.3 | 1.3 |
| Measured Beta (β) | | >3 | 1.1 | 1.1 | 1.2 |

Significantly lower excess noise in all gain-mode detectors was observed, compared to the prior art, conventional devices.

Thus, there has been disclosed a low-noise gain-mode impurity band conduction detector. It will be readily apparent to those skilled in this art that various changes and modifications of an obvious nature may be made, and all such changes and modifications are considered to fall within the scope of the present invention, as defined by the appended claims.

What is claimed is:

1. A low-noise gain-mode impurity band conduction detector comprising:
   (a) a semiconductor substrate;
   (b) a first contact layer formed on one surface of said substrate;
   (c) a detecting layer formed on said first contact layer, said detecting layer having a first thickness and a first dopant concentration;
   (d) a gain layer formed on said detecting layer, said gain layer having a second thickness and a second dopant concentration, said second thickness less than that of said first thickness and said second dopant concentration less than that of said first dopant concentration;
   (e) a blocking layer, whose doping level is lower than both of said detecting layer and said gain layer, formed on said gain layer; and
   (f) a second contact layer formed on said blocking layer.

2. The detector of claim 1 wherein said substrate and each of said layers comprise a material selected from the group consisting of silicon, germanium, and GaAs.

3. The detector of claim 1 wherein said detector layer and said gain layer are each doped with a shallow dopant that generates impurity banding.

4. The detector of claim 3 wherein said substrate and each of said layers comprise silicon.

5. The detector of claim 4 wherein said dopant is selected from the group consisting of arsenic, gallium, and phosphorus.

6. The detector of claim 5 wherein said dopant consists essentially of arsenic.

7. The detector of claim 6 wherein said first thickness is at least about 6 μm, said second thickness ranges from about 1 to 6 μm, said first dopant concentration ranges from about 4 to $10 \times 10^{17}$ $cm^{-3}$ and said second dopant concentration ranges from about 1 to $5 \times 10^{17}$ $cm^{-3}$.

8. The detector of claim 7 wherein said first thickness is at least about 10 μm, said second thickness ranges from about 3 to 4 μm, said first dopant concentration ranges from about 5 to $8 \times 10^{17}$ $cm^{-3}$, and said second dopant concentration ranges from about 2 to $5 \times 10^{17}$ $cm^{-3}$.

9. The detector of claim 4 wherein said first contact layer comprises antimony-doped or arsenic-doped silicon and wherein said second contact layer comprises arsenic-doped silicon.

10. A low-noise gain-mode impurity band conduction detector comprising:
    (a) a silicon substrate;
    (b) a first contact layer formed on one surface of said substrate, said first contact layer comprising silicon doped with antimony or arsenic;
    (c) a detecting layer formed on said first contact layer, said detecting layer comprising silicon doped with arsenic and having a first thickness and a first dopant concentration;
    (d) a gain layer formed on said detecting layer, said gain layer comprising silicon doped with arsenic and having a second thickness and a second dopant concentration, said second thickness less than that of said first thickness and said second dopant concentration less than that of said first dopant concentration;
    (e) a blocking layer formed on said gain layer, said blocking layer comprising silicon doped with arsenic at a lower level than either said detecting layer or said gain layer; and
    (f) a second contact layer formed on said blocking layer, said second contact layer comprising silicon doped with arsenic.

11. The detector of claim 10 wherein said first thickness is at least about 6 μm, said second thickness ranges from about 1 to 6 μm, said first dopant concentration ranges from about 4 to $10 \times 10^{17}$ $cm^{-3}$, and said second dopant concentration ranges from about 1 to $5 \times 10^{17}$ $cm^{-3}$.

12. The detector of claim 11 wherein said first thickness is at least about 10 μm, said second thickness ranges from about 3 to 4 μm, said first dopant concentration ranges from about 5 to $8 \times 10^{17}$ $cm^{-3}$, and said second dopant concentration ranges from about 2 to $5 \times 10^{17}$ $cm^{-3}$.

13. A method of fabricating a low-noise gain-mode impurity band conduction detector, comprising the steps of:
    (a) providing a semiconductor substrate;
    (b) forming a first contact layer on one surface of said substrate;
    (c) forming a detecting layer on said first contact layer, said detecting layer having a first thickness and a first dopant concentration;
    (d) forming a gain layer on said detecting layer, said gain layer having a second thickness and a second dopant concentration, said second thickness less than that of said first thickness and said second dopant concentration less than that of said first dopant concentration;
    (e) forming a blocking layer on said gain layer, said blocking layer doped to a lower level than either of said detecting layer or said gain layer; and (f) forming a second contact layer on said blocking layer.

* * * * *